United States Patent

Patel et al.

[11] Patent Number: 5,821,771
[45] Date of Patent: Oct. 13, 1998

[54] METHOD AND APPARATUS FOR MONITORING OR FORCING AN INTERNAL NODE IN A PROGRAMMABLE DEVICE

[75] Inventors: Rakesh H. Patel, Cupertino; John Costello; Myron Wong, both of San Jose, all of Calif.

[73] Assignee: Altera Corporation, San Jose, Calif.

[21] Appl. No.: 651,101

[22] Filed: May 21, 1996

[51] Int. Cl.[6] .................................................. H03K 17/00
[52] U.S. Cl. ............................... 326/38; 326/16; 326/33; 327/530
[58] Field of Search .............................. 326/16, 38–41, 326/33; 365/189.06; 327/530

[56] References Cited

U.S. PATENT DOCUMENTS

| | | | |
|---|---|---|---|
| 4,617,479 | 10/1986 | Hartmann et al. | 307/465 |
| 5,260,611 | 11/1993 | Cliff et al. | 307/465 |
| 5,291,446 | 3/1994 | Van Buskirk et al. | 365/189.06 X |
| 5,426,391 | 6/1995 | Tedrow et al. | 327/530 |
| 5,493,239 | 2/1996 | Ziotnick | 326/38 |
| 5,528,600 | 6/1996 | El Ayat et al. | 326/16 X |
| 5,565,792 | 10/1996 | Chiang et al. | 326/40 |

OTHER PUBLICATIONS

"MAX 9000 Programmable Logic Device Family," *Altera Databook*, Mar. 1995, Chapter 4, pp. 117–152.

"MAX 7000 Programmable Logic Device Family," *Altera Databook*, Mar. 1995, Chapter 5, pp. 153–218.

*Primary Examiner*—David R. Hudspeth
*Attorney, Agent, or Firm*—Townsend and Townsend and Crew

[57] ABSTRACT

A system and method for programming elements in an integrated circuit. The system allows for selection of an internal voltage supply and an external supply. Provision is also possible for improved testing techniques.

38 Claims, 2 Drawing Sheets

METHOD AND APPARATUS FOR MONITORING OR FORCING AN INTERNAL NODE IN A PROGRAMMABLE DEVICE

BACKGROUND OF THE INVENTION

The present invention relates in general to programmable circuits, and in particular to a novel circuit technique that allows the monitoring or forcing of a node internal to a programmable integrated circuit to improve testability and reliability of the circuit.

Some programmable circuits such as erasable programmable read only memories (EPROMs) require the application of programming voltages ($V_{pp}$ is a common nomenclature) and current ($I_{pp}$), with a voltage higher than the regular supply voltage. An external high-current power supply is therefore needed to program an EPROM device. Electrically erasable programmable read only memories (EEPROMs) employ a different programming mechanism. In the case of EEPROMs, electrons flow to or from the EEPROM cell floating gate by a conduction mechanism known as Fowler-Nordheim tunneling. The current requirement therefore is much reduced for the programming of EEPROMs. Programming is accomplished by applying a high voltage programming signal $V_{pp}$ to the tunnel node of the EEPROM cell turning it into a conductive state. The EEPROM cell is erased by applying or coupling of $V_{pp}$ to the floating gate and the source terminals of the cell, turning it into a nonconductive state.

The programming voltage $V_{pp}$ is typically 12 to 15 volts, and in the case of EEPROM can be generated internally by the circuit by using well know charge pump techniques. There are a number of advantages associated with internally generating the $V_{pp}$ signal. It not only eliminates the need for an additional power supply, it also no longer requires the user to make provisions on the board for an additional high voltage power supply source.

In some cases, an external $V_{pp}$ in such PLDs may also require an extra programming step where the PLD is placed on a separate programming environment to apply the $V_{pp}$ voltage for programming the EEPROM cells. The PLD is then placed on the target board after the PLD has been configured. An internally generated $V_{pp}$ eliminates this additional handling of the part which reduces cost and improves reliability. These advantages have led to a favored trend toward providing on-chip $V_{pp}$ generators in such programmable devices.

There are, however, certain drawbacks when programmable devices internally generated $V_{pp}$. One potential difficulty arises from the analog nature of the charge pump circuits used to generate boosted voltages. These circuits are less predictable than conventional digital circuits, and more prone to process variations. In addition, these problems are magnified as power supply voltages drop (e.g., from 5 to 3 volts). A particular potential problem with an internally generated $V_{pp}$ in EEPROM devices is current limitations. The EEPROM cells consume a small amount of current ($I_{pp}$) during programming. Thus, the $V_{pp}$ generator must be capable of supplying the total $I_{pp}$ required by the EEPROM during programming. It is possible, however, that due to process variations, or with use over time, the total $I_{pp}$ requirement for the EEPROM exceeds the designed $I_{pp}$ capacity of the $V_{pp}$ generator. This condition causes the voltage at $V_{pp}$ to drop which may result in faulty programming.

An important measure of circuit performance in EEPROM circuits is therefore the $I_{pp}$ margin provided by the on-chip $V_{pp}$ generator. It is highly desirable to be able to accurately test for the $I_{pp}$ margin. Existing EEPROM-based programmable devices, however, do not provide for a reliable method of measuring the voltage level of the internally generated $V_{pp}$ or the $I_{pp}$ margin. Typically, the overall programming ability of the device is tested by writing into the cells and reading the data back. This test is repeated after high temperature burning to simulate extended period of use. However, neither one of these tests provides an accurate measure of the level of the $V_{pp}$ or the $I_{pp}$ margin.

There is therefore a need for a circuit that allows for flexibility in the design of integrated circuits as supply voltages are reduced. In addition, these is a need for a circuit that allows monitoring of the $V_{pp}$ voltage and measuring of the $I_{pp}$ margin in programmable devices.

SUMMARY OF THE INVENTION

The present invention offers a circuit that includes logic and programmable elements to programmably allow the application of an external $V_{pp}$ in case of an unreliable internal $V_{pp}$ generator. According to another embodiment, the invention includes a programmable device that provides a means for monitoring internal nodes and collecting test information on memory cell programming margins. The programmable device is designed with an internal high voltage generator circuit to generate the programming voltage $V_{pp}$.

In a preferred embodiment, the manufacturer can select various modes of operation for the programmable device by programming the programmable elements. In a first normal mode of operation, the device is placed in an internal $V_{pp}$ state. In another (test) mode, the device allows the monitoring of the internally generated $V_{pp}$ through a pin to determine the programming voltage and current margins. In a third mode, the device is placed in an external $V_{pp}$ state where $V_{pp}$ can be supplied externally in the case of an unreliable internal $V_{pp}$.

Accordingly, in one embodiment, the present invention provides a programmable device including: circuit elements that require a programming voltage higher than the circuit power supply voltage, a high voltage generator circuit for generating an internal voltage from the circuit power supply voltage, and a programmable switch for connecting the circuit elements to the internal programming voltage in one state and to an external pin in another state. The programmable device further includes programmable elements to control the state of the switch in various modes of operation. The switch can be programmed to connect the internal programming voltage to the external pin for monitoring the operation of the high voltage generator circuit.

A better understanding of the nature and advantages of the present invention may be had with reference to the detailed description and the drawings below.

DETAILED DESCRIPTION OF THE PREFERRED EMBODIMENTS

Figure 1A:
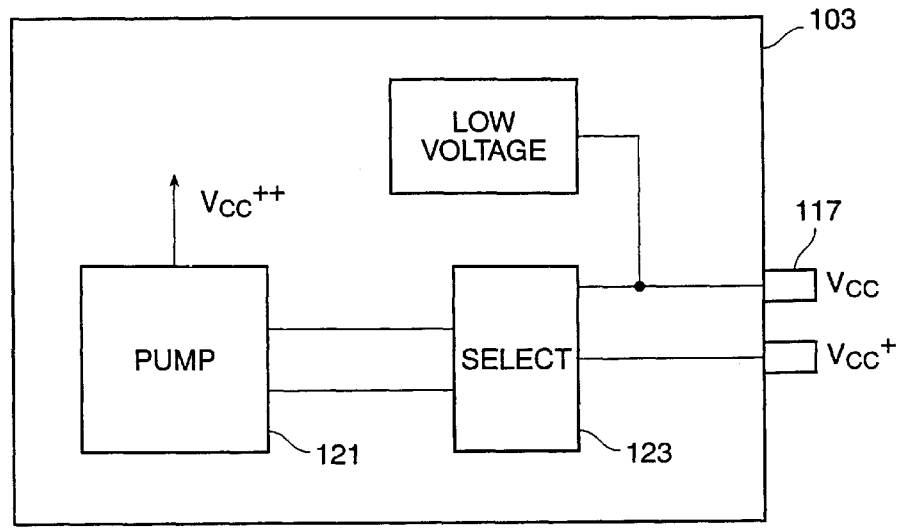
FIG. 1A is an overall illustration of one embodiment of the invention.

FIG. 1A illustrates one aspect of the invention. An integrated circuit 103 is provided with a voltage boost circuit 121 such as a charge pump. The integrated circuit is also provided with a select circuit 123. The select circuit may be programmably connected (via, for example, a metal mask option, electric or laser blown fuse, or other programmable element) to a power supply pin 117, which may be, for example, a Vcc pin. In this mode, a higher voltage (designated Vcc++ in FIG. 1A is generated from Vcc. Normally, Vcc will also be provide to other low voltage circuit elements in addition to the circuit 121. The programmable element may also (or alternatively) be programmed to connect the circuit 121 with a higher voltage supply (designated Vcc+ in FIG. 1A) to the circuit 121.

Several applications of the circuit in FIG. 1A are possible. For example, suppose the circuit designer is migrating the device from a Vcc supply of one voltage to another, lower voltage. This migration has taken place as circuits have moved from 12 v. supplies to 5 v. supplies, and more recently as circuits have migrated from 5 v. supplies to 3 v. supplies. In many situations, it is possible that the rest of the circuit can easily be migrated from the higher voltage to the lower voltage, but the voltage boost circuit will cause difficulties as the integrated circuit moves to mass production. In some cases, it is possible that the first generation of such a device will not function properly at all because of the lower voltage supplied to the boost circuit. Conversely, many customers will, at least initially, provide both high and low voltage supplies in a system since not all integrated circuits in a system will simultaneously move from a higher voltage supply to a lower voltage supply. In such cases, the manufacturer of the integrated circuit can easily convert the circuit to provide for the boost circuit to operate off of the higher voltage supply from pin Vcc+ by, for example, a simple modification of a metal mask, with little customer impact. Other applications will become apparent from the disclosure herein.

Figure 1B:
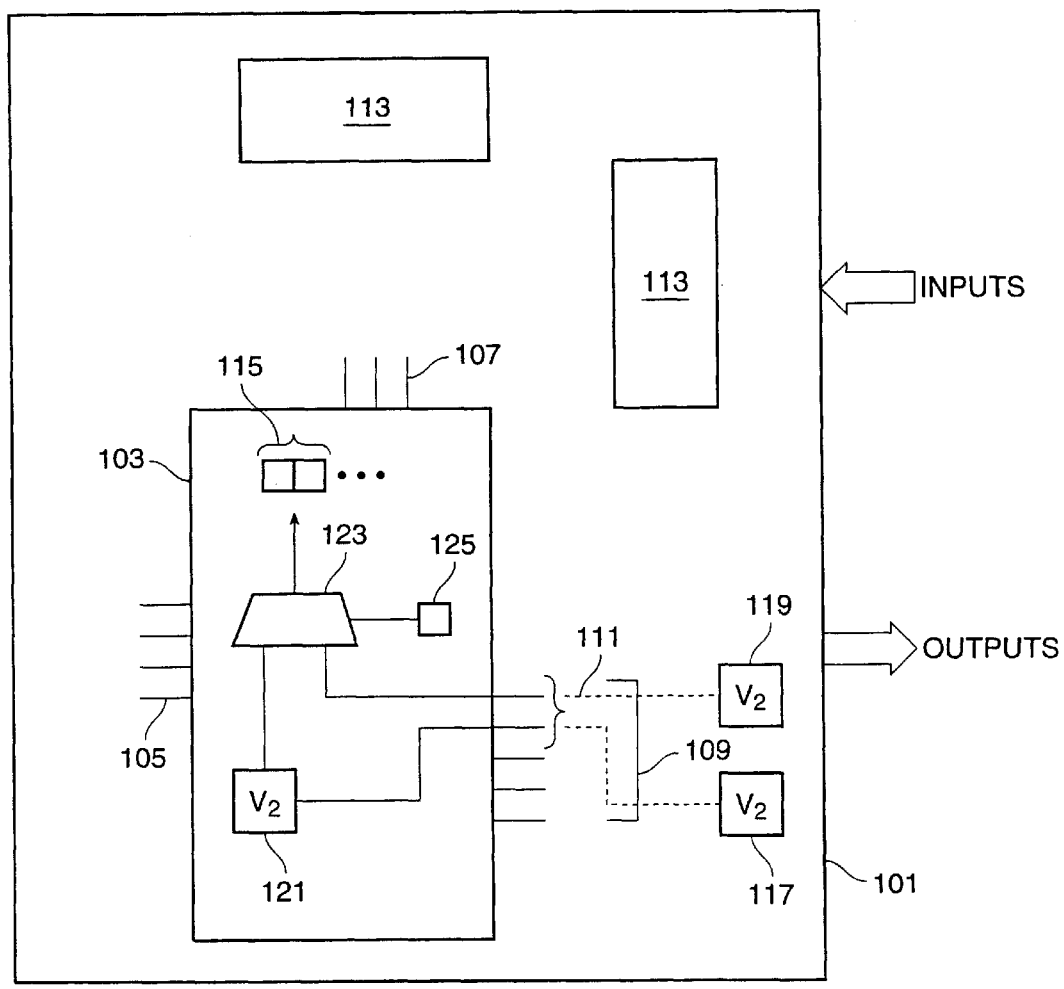
FIG. 1B is an overall system illustration of one embodiment of the invention in a typical system.

FIG. 1B illustrates a system 101 in which an integrated circuit 103 such as a programmable logic device may be utilized. Programmable logic devices (sometimes referred to as a PALs, PLAS, FPLAs, PLDs, EPLDs, EEPLDs, LCAs, or FPGAs), are well know integrated circuits that provide the advantages of fixed integrated circuits with the flexibility of custom integrated circuits. These devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX™ series of PLDs. The former are described in, for example, the Altera Data Book, March 1995, incorporated herein by reference. The latter are described in, for example, U.S. Pat. No. 5,260,611, and incorporated herein by reference for all purposes. Other devices with which the invention may be utilized include flash memory, ASICs, memories, microprocessors, and other circuits.

Programmable logic devices may be used in systems 101 in a wide variety of applications such as, merely by way of example, telecommunications systems, automotive systems, control systems, consumer electronics, personal computers, and others. The system may be provided on a single board, on multiple boards, or even within multiple enclosures. The system 101 utilizes programmable logic device 103. Device 103 is provided by the system with various inputs on pins 105, and provides the system output on pins 107. Pins 105 and 107 in some cases are programmable as input, output or input/output pins and are, therefore, interchangeable. Other pins 109 may also be connected to the system and include, for example, control pins, clock, and power supply pins 111.

Pins 111a/111b may be the same pin. Other integrated circuits 113 in the system may include special purpose integrated circuits, microprocessors, memories, and other integrated circuits of the type known to those of skill in the art.

Programmable logic devices are one example of integrated circuits that require boosted voltages. For example, in some types of programmable logic devices it is necessary to provide a voltage level higher than a normal operating voltage level to program control elements 115 of the programmable logic device. For example, the normal operational voltage levels in the system 101 may be 5 v or 3 v, while it is necessary to supply some higher voltage level to program the control elements 115 of the programmable logic device (such as 12 to 15 v). Typical programmable logic devices requiring high programming voltages utilize EEPROM (electrically erasable and programmable read only memory) elements, EPROM, or flash memory elements. In such devices it is necessary to provide memory cells with a high voltage supply during programming operations and/or erasure.

In some systems, it may be possible to connect the programmable logic device to either one of or both of two independent, externally generated power supplies 117 and 119 in the system 101. For example, power supply 117 may be a 3 v power supply, while power supply 119 may be a 15 v power supply. In such cases, it is possible to permanently or selectively connect the second power supply to one or more of the pins on programmable logic device 103 for programming operations, while another pin(s) is connected to the "normal" supply voltage for normal operations. These externally generated power supplies have the advantage that they will typically be more stable than an internally generated power supply. However, other systems are not provided with such high voltage power supplies, such power supplies are not economically incorporated into such systems, process variations result in unstable operation of a particular device, or it is desirable to use an internal supply during routine (non-test) operations. Accordingly, the invention herein provides for an internal high voltage power supply 121, normally generated from a lower voltage external power supply 117.

In still other systems, the programming power is always internally generated. However, it is sometimes desirable to select between two voltage supplies for generation of the internally generated voltage. For example, in 3 v systems, it may be necessary to generate the internal programming voltage from a 3 v supply. In other systems, it is possible to have access to two power supplies, one of which is higher than the other (for example, 3 v and 5 v). In such systems, it is desirable to generate the programming voltage from the higher supply, while using the lower 3 v supply for normal operation, and the invention herein is used to select between the two externally generated power supplies, or select for use of the externally generated high voltage when it is available.

The programmable logic device 103 further includes a programmable switch 123 controlled by a control element or control elements 125, which are preferably but not necessarily manufacturer programmable (e.g., EPROM, EEPROM, flash, antifuse, SRAM, metal mask options, or fuse elements). Depending upon the status of control element 125 the programmable switch 123 selects between programming power from the internal power supply 121, and a high voltage supply pin 111 that is connected to system power supply 119. This functionality is shown conceptually as operating by way of a multiplexer that selects between the internal and external power supplies (or others). This functionality could alternatively be provided by, for example, permanently connecting the output of the internal supply to a programming power supply node, and selectively connecting an external power supply to the same node. Other techniques for selecting between internal and external power supplies will be apparent to those of skill in the art.

In systems where the external high voltage power supply is required (such as with PLDs that have defective internal generators), the programmable switch 123 may be programmed to provide the control elements with programming power from the system power supply 119. When power supply 119 is not available, the programmable switch 123 will be set to supply programming power to the control elements 105 from the internal supply 121.

In alternative embodiments where the internal power supply is always used for power generation, the switch 123 is used to select between a high and a low voltage supply for generation of the programming power supply. Such "switch" may be implemented in some embodiments through use of a metal mask option, for example.

Figure 2:
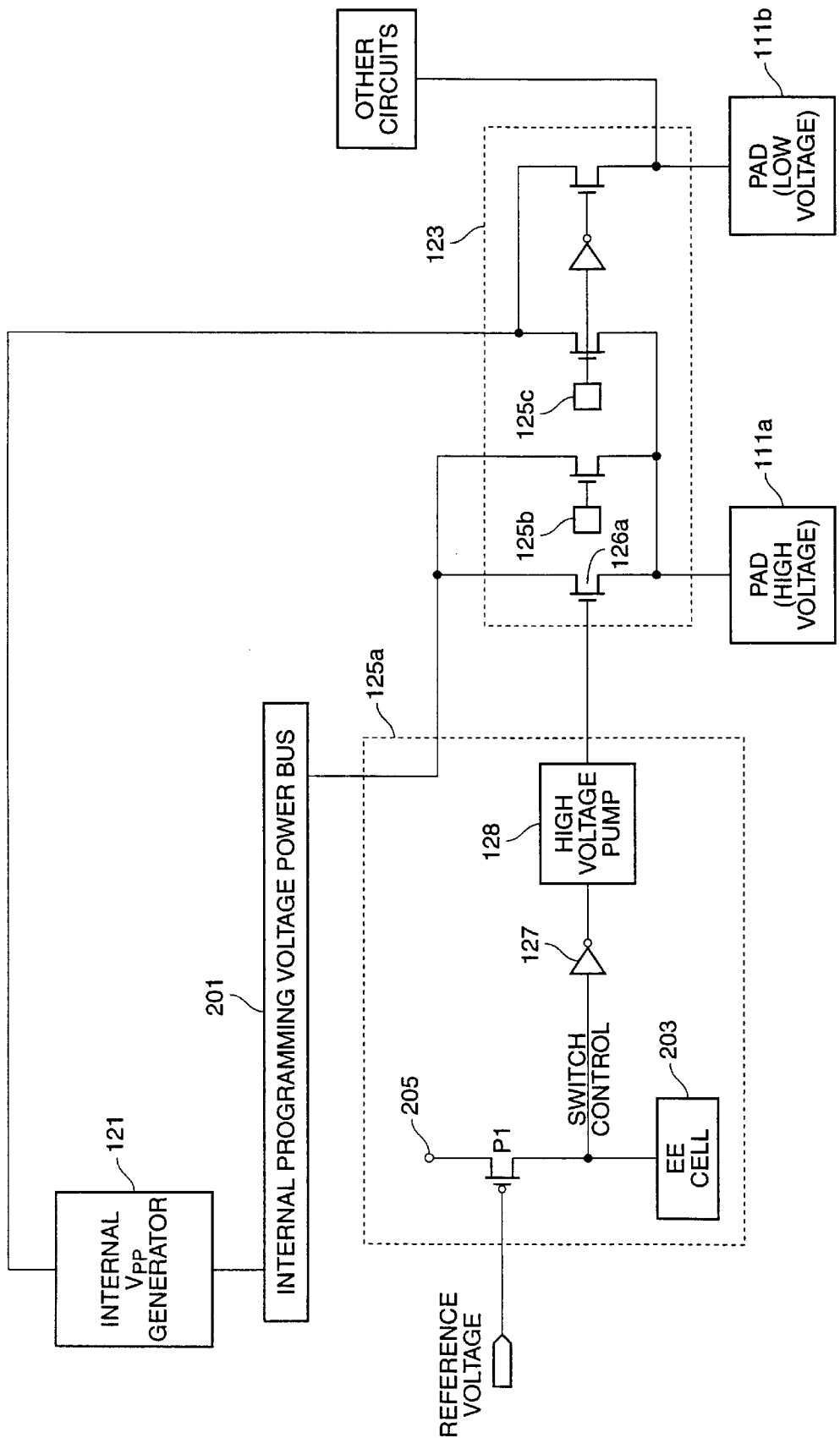
FIG. 2 is a block diagram illustration of the invention in an integrated circuit.

FIG. 2 illustrates aspects of one embodiment of the programmable logic device 103 in greater detail. As shown, the device is provided with an internal programming voltage supply power bus 201. Internal control bits (or other elements) utilize power from this bus during, for example, programming operations. Pad connect switch 123 is utilized to select between several operational states. For example, in one mode, the power connect switch 123 may connect the pad 111a directly to the power bus 201. In a second mode the pad connect switch 123 disconnects the pad 111a from the power bus 201. In a third possible mode, the pad connect switch connects the power bus 201 to the pad 111 such that the operation of $V_{pp}$ generator 121 may be monitored. In still further possible modes the pad connect switch may select between various pads 111a and 111b.

FIG. 2 illustrates some of the possible modes of operation which may be implemented in particular embodiment of the invention. In this particular embodiment, control element 125a is used to connect the pad 111a to the internal programming voltage power bus 201 directly, when a high voltage supply is, for example, available from the particular system in which the device is utilized, via transistor or other connect circuit 126a. The pad 111a is connected to the power bus 201 for monitoring of, for example, current supply level, via control element 125b. The pad 111a or the pad 111b are alternately connected to the input of the $V_{pp}$ generator via control element 125c. For example, if a $V_{pp}$ voltage of 15 v. is needed, control element may connect the pad 111a (connected to a 5 v. supply for example) to the input of $V_{pp}$ generator in some cases (with the pad 111b at 3 v. for example for supply of other circuits on the device). In cases where a higher supply is not available, the pad 111b may be connected to the input of the $V_{pp}$ generator. As shown, therefore, the device may allow the pad 111b to connect directly to the bus 201, or may allow for selection of input pins 111a or 111b for supply to the voltage boost circuit when the pad 111b is not connected directly to the bus 201. The embodiment in FIG. 2 also allows for testing by connecting the output of the $V_{pp}$ generator to be selectively monitored on pin 111a (or to another monitoring point on the device).

The operation of pad connect switch 123 is controlled by one or more programmable elements 125. In the case where the control switch connects only between a connected and non-connected operation of the pad 111, only a single programmable element is necessary. In other embodiments, where the control switch selects between more than two possible modes of operation, two or more programmable elements may be provided, although only one is shown in the figure for ease of illustration. The central elements may be the same or different. For example, one may be a metal mask option, while one is a laser blown fuse while one is an EEPROM.

A typical programmable element is shown in FIG. 2, which is based on EEPROM technology. While this technology is used for illustration, other technologies may be used such as electrically or laser blown fuse technology, or others. In this embodiment the EE cell 203 in the programmable element is a manufacturer programmable bit. The bit is connected in series with PMOS transistor to $V_{cc}$ at node 205 via a reference voltage (which will typically be less than $V_{cc}$). When the bit is, for example, programmed to be conductive, the output of the programmable element will be set to a selected logic level, optionally through the use of inverter 127. In such cases the pad connect switch 123 will permit the externally supplied voltage to be supplied from pad 111a to the programming voltage power bus. When SWITCH CONTROL is set to another logic level, the pad is not connected to the power bus. Optimized high voltage pump 128 drives transistors with a sufficiently high voltage to avoid threshold drops in the transistor therein.

As shown in FIG. 2, the control bit 125 may include an EE cell 203 connected between the drain of PMOS transistor 205 and ground. The source of transistor 205 is connected to $V_{cc}$, while the gate is connected to a reference voltage. The reference voltage is used to provide a current to change the input of converter 127 when EE cell 203 is not conducting.

The device can also be used to improve testability of such devices. In this mode, a probe can be placed on the external power supply pin 111a. The device can be tested to ensure that the process has not caused $V_{pp}$ of the device to drop below a desired value, typically the value required to ensure reliable programming. This is accompanied with central bit 125b. Bit 125c selects which pin (111a or 111b) to use as the adjust to $V_{pp}$ generator 121.

The above description is illustrative and not restrictive. Many variations of the invention will become apparent to those of skill in the art upon review of this disclosure. Merely by way of example the invention may be used with devices other than programmable logic, or with voltage levels other than those referred to above. The scope of the invention should, therefore, be determined not with reference to the above description, but instead should be determined with reference to the appended claims along with their full scope of equivalents.

What is claimed is:

1. A method of designing and manufacturing integrated circuits comprising the steps of:

designing an integrated circuit with a voltage boost circuit, said integrated circuit comprising a select circuit; and if said boost circuit provides an acceptable boosted voltage, operating said select circuit in a first mode to utilize voltage input from a first pin in said boost circuit; and if said boost circuit does not provide an acceptable boosted voltage, operating said select circuit in a second mode to utilize a voltage input from a second pin.

2. The method as recited in claim 1 wherein said first pin is a $V_{cc}$ pin, said $V_{cc}$ pin providing power to low voltage elements in said integrated circuit.

3. The method as recited in claim 1 wherein, in said second mode of operation, said select circuit provides input directly to a high voltage bus from said second pin.

4. The method as recited in claim 1 wherein, in said second mode of operation, said select circuit provides a higher voltage input to said boost circuit from said second pin.

5. The method as recited in claim 1 wherein said select circuit selectively connects said second pin to a boosted voltage test circuit.

6. The method as recited in claim 1 wherein said select circuit operates under the control of selective metal mask connections.

7. The method as recited in claim 1 wherein said select circuit operates under control of an EPROM or EEPROM cell.

8. The method as recited in claim 1 wherein said select circuit operates under control of a fuse or antifuse.

9. The method as recited in claim 1 further comprising the steps of:
   modifying circuit or manufacturing process parameters for said integrated circuit when said boost circuit does not provide said acceptable voltage; and
   making later versions of said integrated circuit wherein said first pin is utilized as an input to said boost circuit.

10. The method as recited in claim 1 wherein said integrated circuit is a programmable logic device.

11. The method as recited in claim 1 wherein said voltage boost circuit is utilized to program EEPROM, EPROM, or antifuse transistors.

12. The method as recited in claim 1 wherein it is determined if said boost circuit provides an acceptable boosted voltage by determining a current output of said boost circuit.

13. The method as recited in claim 1 wherein said integrated circuit is used in single voltage supply systems if said boost circuit provides said acceptable boosted voltage, and utilizing said integrated circuit in a dual voltage supply system if said boost circuit does not provide said acceptable boosted voltage.

14. A method of manufacturing integrated circuits comprising the steps of:
   designing an integrated circuit with a voltage boost circuit;
   selectively connecting an output of said voltage boost circuit to a pin or other test point of said integrated circuit; and
   monitoring operation of said voltage boost circuit when said pin or other test point is selectively connected to said output of said voltage boost circuit.

15. The method as recited in claim 14 wherein said monitoring step is a step of identifying an output current capacity of said voltage boost circuit.

16. The method as recited in claim 14 wherein said step of selectively connecting comprises the step of connecting said pin with a metal mask or EEPROM.

17. The method as recited in claim 14 wherein said integrated circuit is a programmable logic device.

18. An integrated circuit comprising:
   a) programmable elements;
   b) at least one power supply pin;
   c) a high voltage internal power generation circuit; and
   d) a programmable switch in said integrated circuit, said programmable switch selectively i) coupling a power supply pin to a high voltage program supply line, or ii) causing said integrated circuit to use said high voltage internal power generation circuit to program said programmable elements if said high voltage internal power generation circuit provides an acceptable boosted voltage.

19. The integrated circuit as recited in claim 18 wherein said programmable elements are EEPROM devices.

20. The integrated circuit as recited in claim 18 wherein said programmable switch selectively connects said high voltage internal power generation circuit to program said programmable elements.

21. The integrated circuit as recited in claim 20 wherein said programmable elements control logic operations in a programmable logic device.

22. The integrated circuit as recited in claim 18 wherein said integrated circuit further comprising a pumped node for generating a voltage at a gate of a transistor, said transistor selectively passing or not passing said high voltage from one of said power supply pins.

23. The integrated circuit as recited in claim 18 in a system comprising only voltage supply below a voltage required to program said programmable elements, wherein said programmable switch is programmed to utilize said high voltage internal power generation circuit to program said programmable elements.

24. The integrated circuit as recited in claim 18 wherein said programmable switch is programmed to permit monitoring of a voltage or current needed to program said programmable elements.

25. A method of operating an integrated circuit comprising:
   selecting between an internal and an external supply for a programming voltage, wherein said internal supply is selected if said internal supply provides an acceptable boosted voltage;
   programming at least one programmable element in said integrated circuit with a high voltage, from said selected internal or external supply; and
   using said integrated circuit to perform a desired operation.

26. The method as recited in claim 25 wherein said desired operation is a programmable logic operation.

27. The method as recited in claim 25 wherein said programmable element is an EEPROM.

28. The method as recited in claim 25 further comprising the step of testing said integrated circuit to determine if said programmable element is programmed with a selected voltage or current.

29. The method as recited in claim 25 wherein said method is carried out in a system with a supply voltage less than a voltage required for programming said programmable element, and wherein said programming step selects said internal supply.

30. A programmable logic integrated circuit device comprising:
   a plurality of EEPROM transistors, said EEPROM transistors selecting a desired logic function in said programmable logic device; and
   a program voltage supply select switch, said program voltage select switch selecting between the use of an internal and an external supply for programming said EEPROM transistors, wherein said internal supply is used if said internal supply provides an acceptable boosted voltage.

31. The programmable logic device recited in claim 30 wherein said EEPROM transistors are placed in an array of logic blocks in said programmable logic device.

32. The programmable logic device recited in claim 30 wherein said programmable logic device is utilized in a system comprising a voltage supply below a voltage required to program said EEPROM transistors, and wherein said program voltage select switch is programmed to select said internal supply.

33. The integrated circuit device as recited in claims 18 or 30 further comprising a metal region selectively connected for internal supply generation from a lower of two possible voltage levels.

34. The programmable logic device as recited in claim 30 wherein said supply select switch further selects for monitoring of a voltage or current needed to program said device.

35. An integrated circuit comprising:
 a) programmable elements;
 b) at least one power supply pin;
 c) a high voltage internal power generation circuit; and
 d) a programmable switch in said integrated circuit, said programmable switch selectively i) coupling a power supply pin to a high program voltage supply line, or ii) causing said integrated circuit to use said high voltage internal power generation circuit to program said programmable elements and is programmed to permit monitoring of a voltage or current needed to program said programmable elements.

36. A method of operating an integrated circuit comprising:
 selecting between an internal and an external supply for a programming voltage;
 programming at least one programmable element in said integrated circuit with a high voltage, from said selected internal or external supply;
 testing said integrated circuit to determine if said programmable element is programmed with a selected voltage or current; and
 using said integrated circuit to perform a desired operation.

37. An integrated circuit comprising:
 a) programmable elements;
 b) at least one power supply pin;
 c) a high voltage internal power generation circuit;
 d) a metal region selectively connected for internal supply generation from a lower of two possible voltage levels; and
 e) a programmable switch in said integrated circuit, said programmable switch selectively i) coupling a power supply pin to a high program voltage supply line, or ii) causing said integrated circuit to use said high voltage internal power generation circuit to program said programmable elements.

38. A programmable logic integrated circuit device comprising:
 a plurality of EEPROM transistors, said EEPROM transistors selecting a desired logic function in said programmable logic device; and
 a program voltage supply select switch, said program voltage select switch selecting between the use of an internal and an external supply for programming said EEPROM transistors, and further selects for monitoring of a voltage or current needed to program said device.

* * * * *